US009565787B2

(12) United States Patent
Ho et al.

(10) Patent No.: US 9,565,787 B2
(45) Date of Patent: Feb. 7, 2017

(54) HEAT DISSIPATION DEVICE LOADING MECHANISMS

(75) Inventors: Chau V. Ho, Auburn, WA (US); Tejinder Pal S. Aulakh, Auburn, WA (US)

(73) Assignee: Intel Corporation, Santa Clara, CA (US)

( * ) Notice: Subject to any disclaimer, the term of this patent is extended or adjusted under 35 U.S.C. 154(b) by 302 days.

(21) Appl. No.: 13/993,335

(22) PCT Filed: Dec. 13, 2011

(86) PCT No.: PCT/US2011/064591
§ 371 (c)(1), (2), (4) Date: Jun. 12, 2013

(87) PCT Pub. No.: WO2013/089677
PCT Pub. Date: Jun. 20, 2013

(65) Prior Publication Data
US 2014/0218870 A1 Aug. 7, 2014

(51) Int. Cl.
*G06F 1/20* (2006.01)
*H05K 7/20* (2006.01)
*H01L 23/36* (2006.01)
*H01L 23/40* (2006.01)

(52) U.S. Cl.
CPC ............... *H05K 7/2039* (2013.01); *G06F 1/20* (2013.01); *H01L 23/36* (2013.01); *H01L 23/4006* (2013.01); *H01L 2924/0002* (2013.01)

(58) Field of Classification Search
CPC .... G06F 1/20; H01L 23/36; H01L 2924/0002; H01L 2924/00; H01L 2924/00; H05K 7/20; H05K 7/2039
USPC .......... 361/679.54, 704, 709, 710, 714, 718; 165/80.3, 104.33, 185, 16.3; 174/16.3; 257/713, 718, 719
See application file for complete search history.

(56) References Cited

U.S. PATENT DOCUMENTS 6,243,266 B1 * 6/2001 Lo ...................... H01L 23/4093 24/458
6,282,093 B1 * 8/2001 Goodwin ............ H01L 23/4006 165/185
6,646,881 B1 * 11/2003 Lai ...................... H01L 23/4006 165/80.3
7,095,614 B2 * 8/2006 Goldmann .......... H01L 23/4006 165/185
7,190,586 B2 * 3/2007 Franz .................. H01L 23/4093 165/185

(Continued)

FOREIGN PATENT DOCUMENTS

WO 2013/089677 A1 6/2013

OTHER PUBLICATIONS

Office Action received for Taiwan Patent Application No. 101145279, mailed on Aug. 26, 2014, 11 Pages of Office Action and 9 Pages of English Translation.

(Continued)

*Primary Examiner* — Courtney Smith
*Assistant Examiner* — Matt Dhillon
(74) *Attorney, Agent, or Firm* — Winkle, PLLC

(57) ABSTRACT

The present description relates to the field of microelectronic assemblies, wherein a heat dissipation device may be incorporated into the microelectronic assembly with a loading mechanism having at least one outrigger that is rotatable or pivotable between a first position and a second position to accommodate different heat dissipation device sizes or shapes.

23 Claims, 6 Drawing Sheets

(56) References Cited

U.S. PATENT DOCUMENTS

| | | | | |
|---|---|---|---|---|
| 7,239,518 | B2 * | 7/2007 | Yang | H01L 23/4006 165/80.3 |
| 7,301,774 | B2 * | 11/2007 | Lee | H01L 23/4006 165/80.2 |
| 7,345,880 | B2 * | 3/2008 | Lo | G06F 1/183 165/185 |
| 7,349,218 | B2 * | 3/2008 | Lu | H01L 23/4006 165/185 |
| 7,440,284 | B1 * | 10/2008 | Lin | H01L 23/4006 165/185 |
| 7,460,372 | B2 * | 12/2008 | Liao | H01L 23/4006 165/80.3 |
| 7,477,519 | B2 * | 1/2009 | Kubo | H01L 23/4006 165/104.33 |
| 7,570,490 | B2 * | 8/2009 | Refai-Ahmed | H01L 23/4093 165/104.33 |
| 7,573,716 | B2 * | 8/2009 | Sun | H05K 1/0201 165/80.3 |
| 7,576,989 | B2 * | 8/2009 | Li | H01L 23/4093 165/185 |
| 7,758,001 | B2 * | 7/2010 | Bouissiere | F16M 11/04 248/206.5 |
| 7,777,329 | B2 * | 8/2010 | Colbert | H01L 23/4093 257/712 |
| 7,782,622 | B1 * | 8/2010 | Sun | H01L 23/4006 165/80.3 |
| 7,969,742 | B2 * | 6/2011 | Liu | H01L 23/4006 165/185 |
| 8,139,360 | B2 * | 3/2012 | Wu | H01L 23/4006 165/185 |
| 8,382,503 | B2 * | 2/2013 | Haswarey | G01R 1/0466 439/331 |
| 8,559,180 | B2 * | 10/2013 | Brown | H01L 23/562 361/747 |
| 8,648,461 | B2 * | 2/2014 | Seki | H01L 23/3675 257/713 |
| 2003/0159819 | A1 * | 8/2003 | Lee | H01L 23/4006 165/185 |
| 2005/0195572 | A1 | 9/2005 | Franz et al. | |
| 2007/0097649 | A1 | 5/2007 | Yang et al. | |

OTHER PUBLICATIONS

International Search Report and Written Opinion Received for PCT Patent Application No. PCT/US2011/064591, Mailed on Sep. 17, 2012, 10 pages.

International Preliminary Report on Patentability and Written Opinion received for PCT Patent Application No. PCT/US2011/064591, mailed on Jun. 26, 2014, 7 pages.

Office Action received for Taiwan Patent Application No. 101145279, mailed on Jun. 16, 2015, 8 pages of English Translation and 8 pages of Taiwan Office Action.

* cited by examiner

HEAT DISSIPATION DEVICE LOADING MECHANISMS

BACKGROUND

Embodiments of the present description generally relate to the field of microelectronic assemblies and, more particularly, to mechanisms used to attach heat dissipation devices within microelectronic assemblies.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
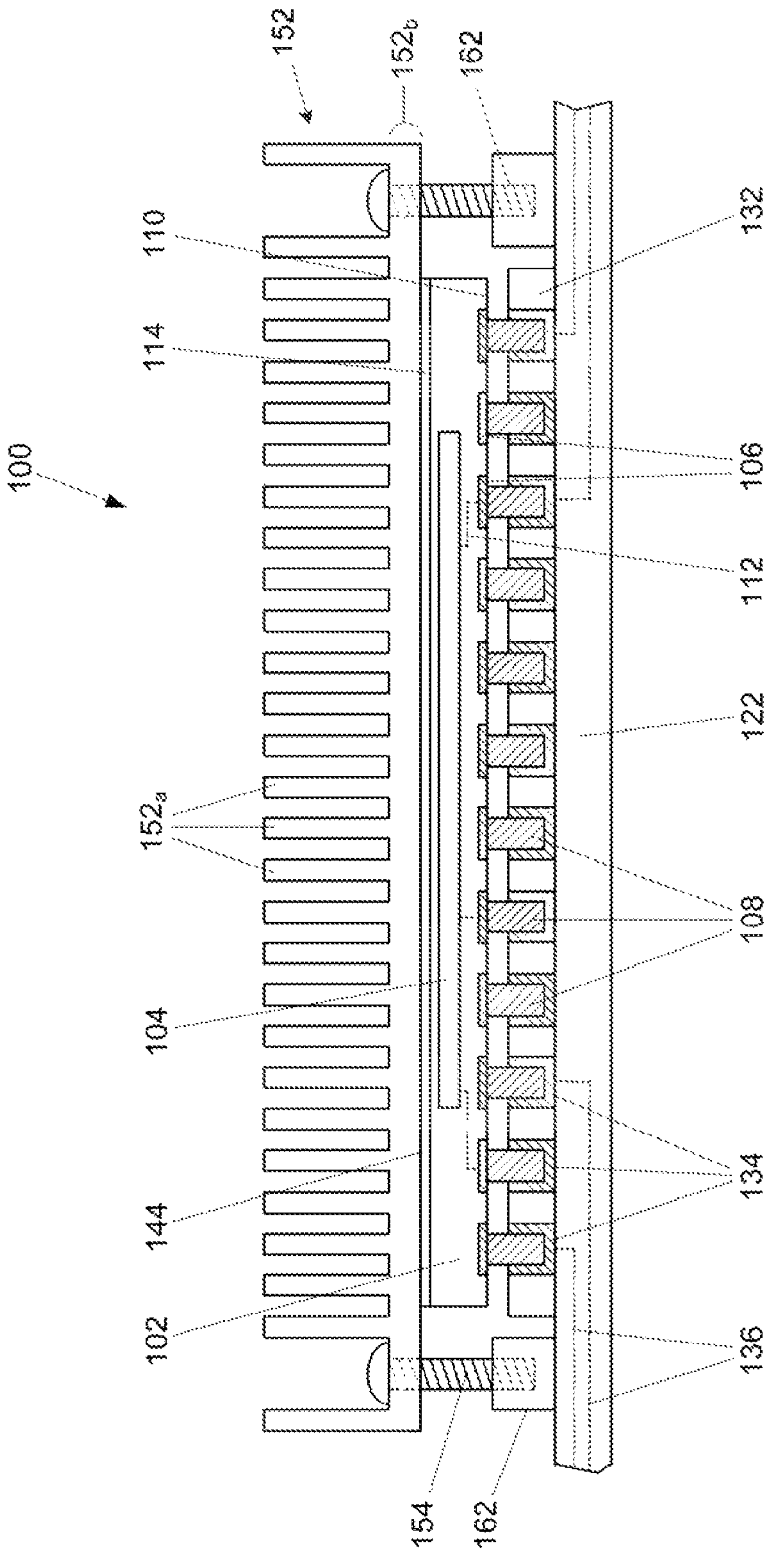
FIG. 1 is a side cross-sectional view of a microelectronic assembly including a microelectronic device mounted on a microelectronic substrate with a microelectronic socket.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present invention. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of microelectronic assemblies, wherein a heat dissipation device may be incorporated into the microelectronic assembly with a loading mechanism having at least one outrigger that is rotatable or pivotable between a first position and a second position to accommodate different heat dissipation device sizes or shapes.

In the production of microelectronic assemblies, microelectronic devices are generally mounted on microelectronic substrates, which provide electrical communication routes between the microelectronic devices and external components. As shown in FIG. 1, a microelectronic assembly 100 may comprise a microelectronic device 102 attached to a microelectronic substrate 122. The microelectronic device 102 may be any appropriate device, such as a packaged microelectronic die 104 (e.g. a microprocessor, a chipset, a graphics device, a wireless device, a memory device, an application specific integrated circuit, or the like), or may be a bare microelectronic die. The microelectronic die 104 may be packaged in any manner known in the art. The microelectronic substrate 122 may be any appropriate substrate, such as an interposer, a motherboard, and the like, and may be primarily composed of any appropriate material, including, but not limited to, bismaleimine triazine resin, fire retardant grade 1 material, polyimide materials, glass reinforced epoxy matrix material, and the like, as well as laminates or multiple layers thereof.

A plurality of interconnects, such as pins 108, may extend from bond pads 106 on a land side 110 of the microelectronic device 102. The microelectronic device bond pads 106 may be in electrical communication with the microelectronic die 104 through conductive routes (shown as dashed lines 112). The interconnect pins 108 may be inserted into conductive recesses 134 within a microelectronic socket 132, wherein the microelectronic socket 132 may be attached to the microelectronic substrate 122 and the microelectronic socket conductive recesses 134 may be in electrical communication with external components (not shown) through conductive routes (shown as dashed lines 136) on or within the microelectronic substrate 122. The microelectronic device bond pads 106, the interconnect pins 108, the microelectronic socket conductive recesses 134, the microelectronic device conductive routes 112, and the microelectronic substrate conductive routes 136 may be composed of any conductive material, including but not limited to metals, such as copper and aluminum, and alloys thereof. As will be understood to those skilled in the art, the microelectronic device conductive routes 112 and the microelectronic substrate conductive routes 136 may be formed as a plurality of conductive traces (not shown) formed on layers of dielectric material (constituting the layers of the microelectronic substrate material), which are connected by conductive vias (not shown).

Figure 2:
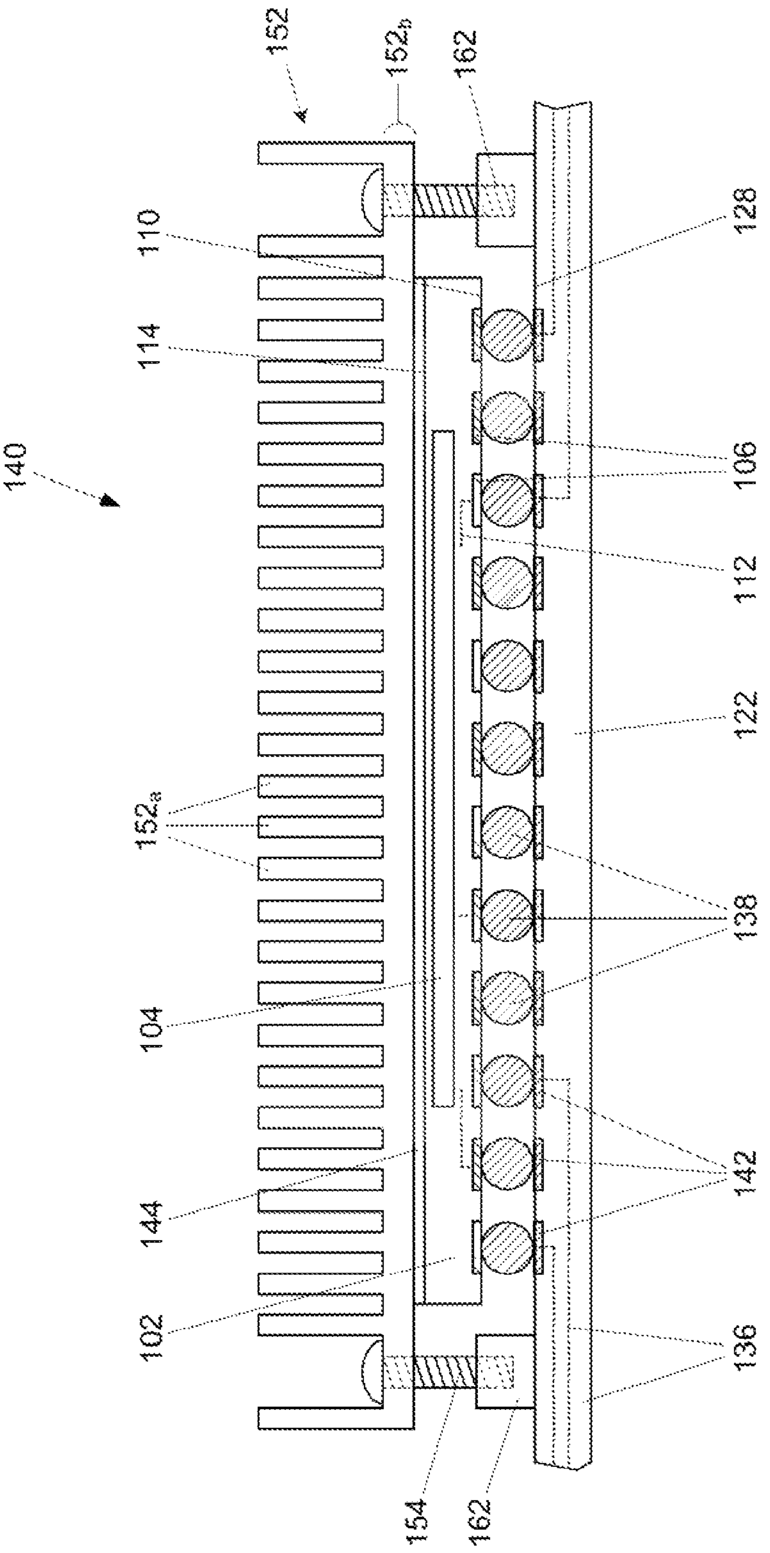
FIG. 2 is a side cross-sectional view of a microelectronic assembly including a microelectronic device mounted on a microelectronic substrate with solder bumps.

In another embodiment of the present description as shown in FIG. 2, a microelectronic assembly 140 may include the microelectronic device 102 attached to the microelectronic substrate 122 through a plurality of solder bump interconnects 138 extending between the microelectronic device bond pads 106 and mirror-image bond pads 126 on an attachment surface 128 of the microelectronic substrate 122. The solder bump interconnects 138 can be made any appropriate material, including but not limited to lead/tin alloys, such as tin/lead solder, such as 63% tin/37% lead solder, or lead-free solders, such a pure tin or high tin content alloys (e.g. 90% or more tin), such as tin/bismuth, eutectic tin/silver, ternary tin/silver/copper, eutectic tin/copper, and similar alloys. When the microelectronic device 102 is attached to the microelectronic substrate 122, the solder bumps interconnects 138 may be reflowed, either by heat, pressure, and/or sonic energy to secure the solder bump interconnects 138 between their respective microelectronic device bond pads 106 and the microelectronic substrate bond pads 126.

As shown in FIGS. 1 and 2, a heat dissipation device 152 may be positioned proximate a back surface 114 of the microelectronic device 102 to be in thermal communication therewith, and may have a thermal interface material 144, such as thermal grease or a phase change material, disposed there between. The heat dissipation device 152 may be secured to the microelectronic substrate 122 with a loading mechanism 162, which attached to the microelectronic substrate 122 by any appropriate technique, including but not limited to adhesives, screws, bolts, and the like. The heat dissipation device 152 may be attached to the loading mechanism 162 with at least one attachment mechanism 154, such as a bolt (shown), a screw, an expansion pin, and the like. The embodiment illustrated herein would have four attachment mechanisms 154. The heat dissipation device attachment mechanism 154 may be coupled to a corresponding attachment mechanism 164 on or in the loading mechanism (illustrated as a bolt threaded into a threaded opening in the loading mechanism 162).

The heat dissipation device 152 may be have any appropriate configuration. In the illustrated embodiment, the heat dissipation device 152 comprises a plurality of projections 152*a* extending substantially perpendicularly from a base 152*b*. It is, of course, understood that the projections 152*a* may include, but are not limited to, elongate planar fin-like structures and columnar/pillar structures. The heat dissipation device projections 152*a* allow heat to be convectively dissipated from the heat dissipation device projections 152*a* into the air surrounding the heat dissipation device 152. The heat dissipation device 152 may be made from any appropriate thermally conductive material, including, but not limited to, aluminum, copper, alloy thereof, and the like. An air circulation mechanism (not shown), such as a fan, may be positioned proximate the heat dissipation device 152 to assist in removing heat from the heat dissipation device projections 152*a*, as will be understood to those skilled in the art.

The microelectronic assembly 100 of FIG. 1 and the microelectronic assembly 140 of FIG. 2 may also include a variety of additional structures and devices, such as microelectronic device retention mechanisms (not shown) for securing the microelectronic device 102 to the microelectronic socket 132 (see FIG. 1) and load leveling devices not shown) for biasing the load of heat dissipation device 152 evenly, as will be understood to those skilled in the art. These potential additional structures and devices have not been illustrated for the sake of clarity, such that the subject matter of the present description is not obscured.

Figure 3:
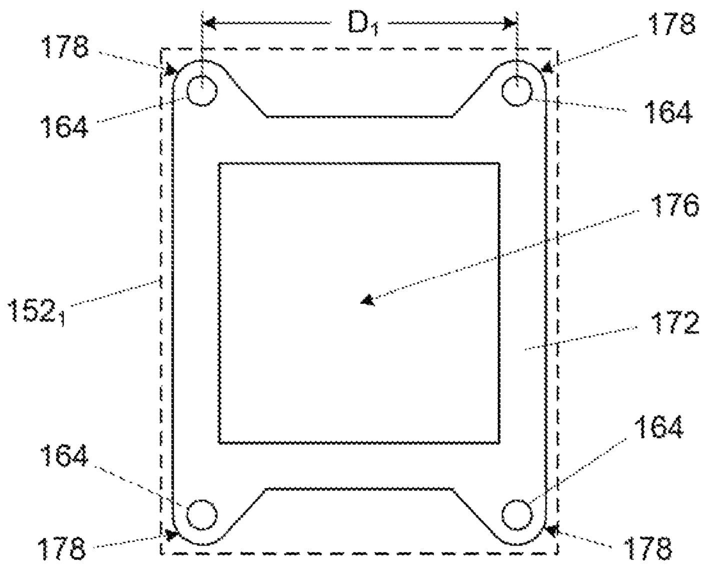
FIG. 3 is a top plan view of a loading mechanism having attachment mechanisms in a narrow configuration, as known in the art.
Figure 4:
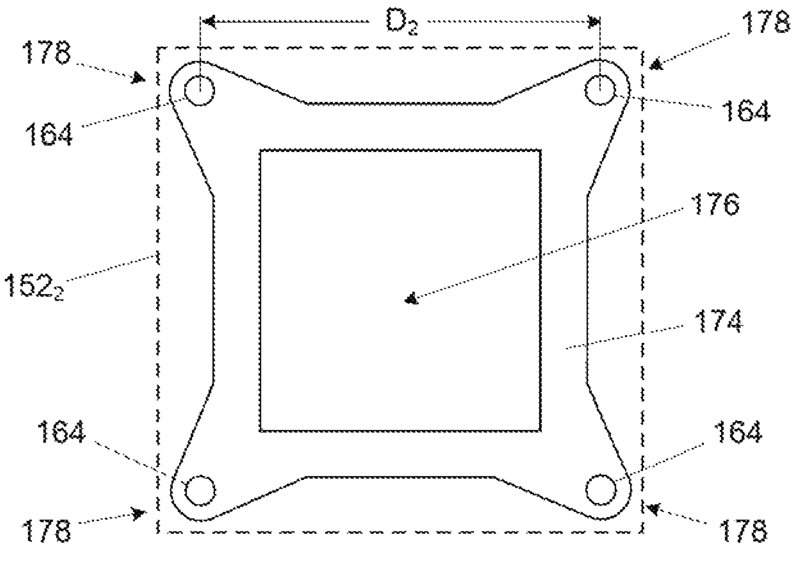
FIG. 4 is a top plan view of a loading mechanism having attachment mechanisms in a wide configuration, as known in the art.

FIGS. 3 and 4 illustrate two embodiments for loading mechanisms such as loading mechanism 142 of FIGS. 1 and 2), as known in the art. As illustrated, a first loading mechanism 172 of FIG. 3 and a second loading mechanism 174 of FIG. 4 may have an opening 176 therethrough, such that the microelectronic device 102 (see FIGS. 1 and 2) and the microelectronic socket 132 (if used—see FIG. 2) may be deposed therein. The first loading mechanism 172 of FIG. 3 and a second loading mechanism 174 of FIG. 4 may each have at least one outrigger 178 extending therefrom and may extend substantially planar with the microelectronic substrate attachment surface 128 (see FIGS. 1 and 2). As illustrated FIG. 3, the outriggers 178 may have a narrow configuration to accommodate a first heat dissipation device (shown as dashed line 152$_1$) compared to the outriggers 178 of FIG. 4, which may be considered a wide configuration, to accommodate a second heat dissipation device (shown as dashed line 152$_2$). In other words, the distance $D_1$ between the attachment mechanisms 164 of a pair of outriggers 178 of FIG. 3 may be smatter than a distance $D_2$ between the attachment mechanisms 164 of a corresponding pair of outriggers 178 of FIG. 4. Both the first loading mechanism 172 of FIG. 3 and a second loading mechanism 174 may be designed to accommodate a common microelectronic device 102, but a different sized or shaped heat dissipation device 152 (see FIGS. 1 and 2). The need for a differing different sized or shaped heat dissipation device 152 may be due to limited or constrained space on differing microelectronic substrates 122. However, having to design and fabricate differing loading mechanisms for a common microelectronic device for differing substrate applications may be prohibitively expensive.

Figure 5:
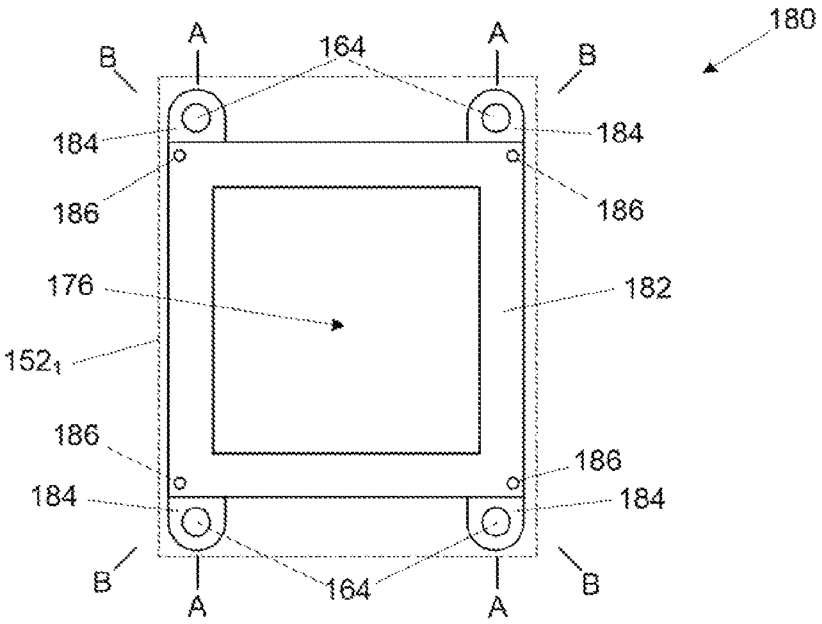
FIG. 5 is a top plan view of a loading mechanism having pivoting outriggers in a first position, according to an embodiment of the present description.

FIG. 5 illustrates an embodiment of the present description wherein the loading mechanism 180 includes a loading mechanism body 182 and at least one pivoting outrigger 184. The pivoting outriggers 184 may be pivotably attached to the mechanism body 182 with a pivot hinge or pin 186. The pivot pin 186 allows the pivoting outrigger 184 to be rotated between a first position A to a second position B. For example, when the pivoting outriggers 184 are in position A, shown in FIG. 5, the loading mechanism 180 may correspond to the narrow configuration of FIG. 3, to accommodate a first heat dissipation device (shown as dashed line 152$_1$). When the pivoting outriggers 184 are in position B, shown in FIG. 6, the loading mechanism 180 may correspond to the wide configuration of FIG. 4 to accommodate a second heat dissipation device (shown as dashed line 152$_2$). The loading mechanism body 182 and the pivoting outriggers 184 may be fabricated from any appropriate substantially ridge material, including but not limited to metals, ceramics, and plastic/polymer materials, as will be understood to those skilled in the art.

Figure 6:
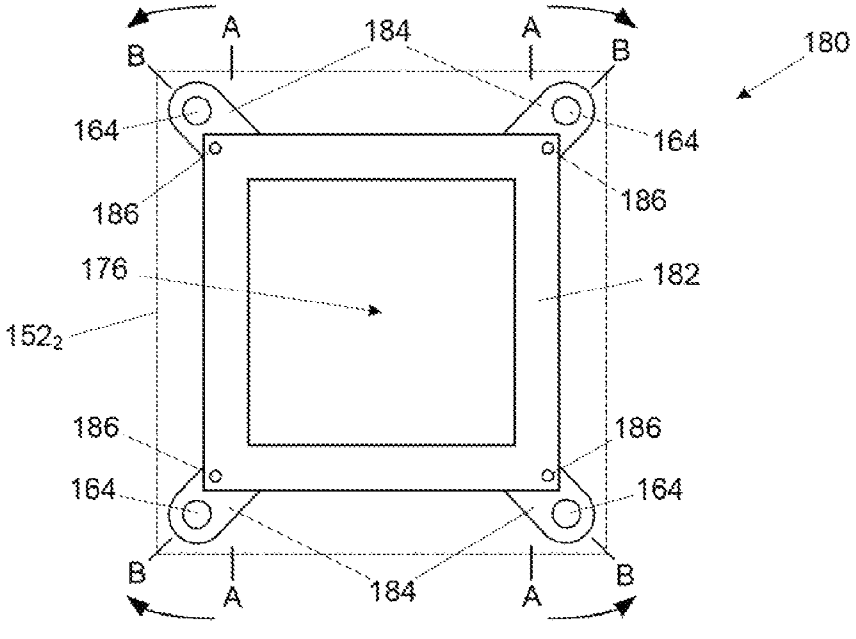
FIG. 6 is a top plan view of a loading mechanism of FIG. 5 having the pivoting outrigger in a second position, according to an embodiment of the present description.

Although FIGS. 5 and 6 illustrate the pivoting outriggers 184 being pivotable between position A and position B at an angle of about 45 degrees, it is understood that position A and position B may be placed at any appropriate angle from one another, and that the pivoting outriggers 184 may be positioned at any appropriate place between position A and position B. Thus, the pivoting outriggers 184 may be rotatable to desired angles so that they will match a particular heat dissipation device 152 (see FIGS. 1 and 2).

Figure 8:
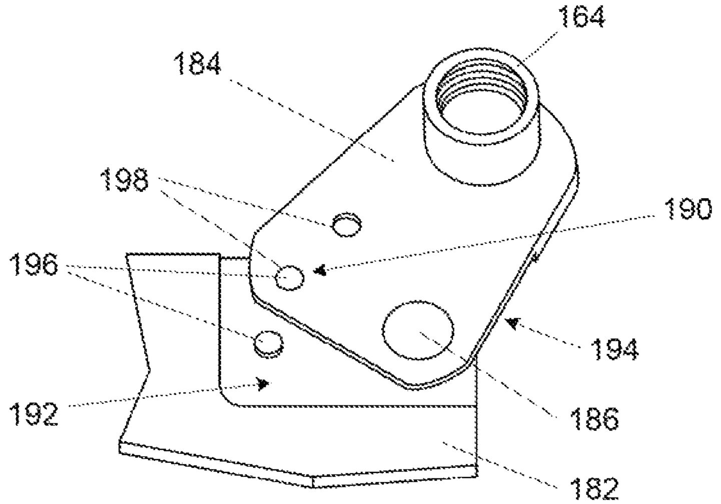
FIG. 8 is an oblique view of a loading mechanism of FIG. 7 having the pivoting outrigger in a second position, according to an embodiment of the present description.

As shown in FIG. 8, a recessed portion 192 of the loading mechanism body 182 may abut a recessed portion 194 of the pivoting outrigger 184 and be attached with the pivot pin 186, such that when the loading mechanic body recessed portion 192 abuts the pivoting outrigger recessed portion 194, it is approximately the thickness T of the loading mechanic body 182.

Figure 7:
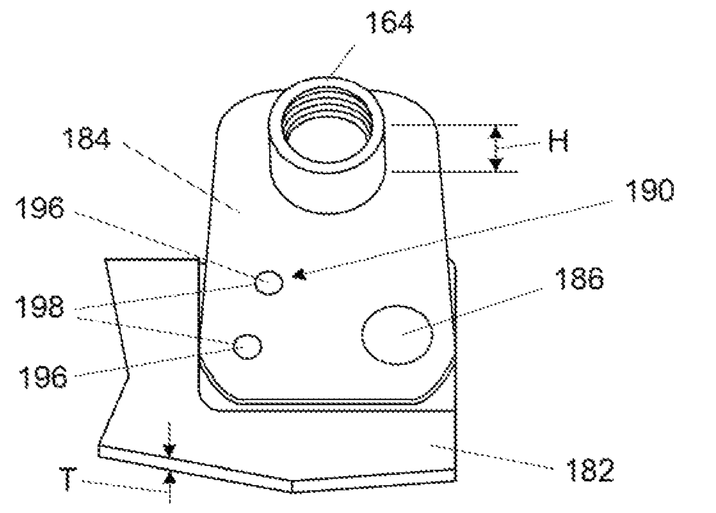
FIG. 7 is an oblique view of a loading mechanism having pivoting outriggers in a first position, according to an embodiment of the present description.

As shown in FIGS. 7 and 8, the loading mechanism body recess portion 192 and/or the pivoting outrigger recessed portion 194 may have a position retention mechanism 190, which may retain the pivoting outrigger 184 in a specific position relative to the loading mechanism body 182. As illustrated, the position retention mechanism 190 may comprise at least one post 196 extending from the loading mechanism body recessed portion 192 and at least one corresponding opening 198 in the pivoting outrigger recessed portion 194. The position retention mechanism post 196 may be inserted into a corresponding pivoting outrigger recessed portion opening 198 to retain the pivoting outrigger 184 in a desired position. It is understood, that the position retention mechanism 190 may be any appropriate means or structure(s) capable of retaining the pivoting outrigger 184 in a specific position relative to the loading mechanism body 182.

As further shown in FIGS. 7 and 8, the outrigger attachment mechanisms 164 may project (shown as a threaded collar having a height H) from pivoting outrigger 184, such that the outrigger attachment mechanisms 164 may engage the heat dissipation mechanism 152, when the heat dissipation mechanism 152 is attached thereto, as previously described.

Figure 9:
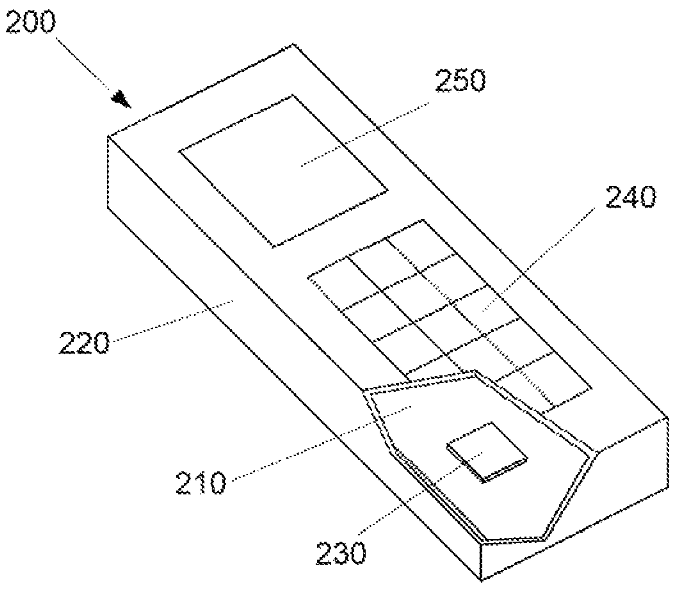
FIG. 9 illustrates an embodiment of an electronic device, according to embodiments of the present description.

FIG. 9 illustrates an embodiment of a electronic system/device 200, such as a portable computer, a desktop computer, a mobile telephone, a digital camera, a digital music player, a web tablet/pad device, a personal digital assistant, a pager, an instant messaging device, or other devices. The electronic system/device 200 may be adapted to transmit and/or receive information wirelessly, such as through a wireless local area network (WEAN) system, a wireless personal area network (WPAN) system, and/or a cellular network. The electronic system/device 200 may comprise a microelectronic substrate 210 (such as the microelectronic substrate 122) within a housing 220. The microelectronic substrate 210 may have a microelectronic assembly 230 attached thereto. The microelectronic substrate 210 may be attached to various peripheral devices including an input device 240, such as keypad, and a display device 250, such an LCD display. It is understood that the display device 250 may also function as the input device, if the display device 250 is touch sensitive. The embodiments of the present description may be incorporated into the microelectronic assembly 230, wherein a microelectronic device (such as microelectronic device 102) and a heat dissipation device loading mechanism (such as loading mechanism 180) are attached to the microelectronic substrate 210, and wherein a heat dissipation device (such as heat dissipation device 152) may be thermal communication with the microelectronic device and attached to the heat dissipation device loading mechanism.

It is understood that the subject matter of the present description is not necessarily limited to specific applications illustrated and described. The subject matter may be applied to other microelectronic device and assembly applications, as well as to area outside of the microelectronic industry, as will be understood to those skilled in the art.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A heat dissipation device loading mechanism, comprising:

a loading mechanism body; and at least one outrigger pivotally attached with a pivot pin to the loading mechanism body, wherein the outrigger is pivotal between a first position and a second position; and a position retention mechanism, separate from the pivot pin, retain the at least one pivotal outrigger in a position at or between the first position and the second position, wherein the position retention mechanism comprises a plurality of pins extending from at least one of the at least one pivotal outrigger and the loading mechanism body, and an opening in at least one pivotal outrigger and the loading mechanism body, wherein a first pin of the plurality of pins is inserted into the opening when the at least one pivotal outrigger is in the first position, and, wherein a second pin of the plurality of pins is inserted into the opening when the at least one pivotal outrigger is in the second position.

2. The heat dissipation device loading mechanism of claim 1, wherein the at least one pivotal outrigger includes an attachment mechanism adapted to engage a heat dissipation device.

3. The heat dissipation device loading mechanism of claim 2, wherein the attachment mechanism extends from the pivotal outrigger.

4. The heat dissipation device loading mechanism of claim 2, wherein the attachment mechanism comprises a threaded collar.

5. The heat dissipation device loading mechanism of claim 1, wherein the loading mechanism body further includes a recessed portion and wherein the pivoting outrigger further includes a recessed portion, and wherein pivoting outrigger recessed portion is pivotally attached to the loading mechanism body recessed portion.

6. The heat dissipation device loading mechanism of claim 5, wherein the loading mechanism body recessed portion abutting the pivoting outrigger recessed portion is approximately the thickness of the loading mechanic body.

7. The apparatus of claim 1, wherein the at least one outrigger position in the first position may engage a first heat dissipation device and wherein the at least one outrigger positioned in the second position may engage a second heat dissipation device having a size differing from the first heat dissipation device.

8. A microelectronic assembly, comprising:

a microelectronic substrate;

a microelectronic device electrically coupled to the microelectronic substrate; and a heat dissipation device loading mechanism attached to the microelectronic substrate proximate the microelectronic device, wherein the heat dissipation device loading mechanism, includes:

a loading mechanism body; and at least one outrigger pivotally attached with a pivot pin to the loading mechanism body, wherein the outrigger is pivotal between a first position and a second position; and a position retention mechanism, separate from the pivot pin, retain the at least one pivotal outrigger in a position at or between the first position and the second position, wherein the position retention mechanism comprises a plurality of pins extending from at least one of the at least one pivotal outrigger and the loading mechanism body, and an opening in at least one pivotal outrigger and the loading mechanism body, wherein a first pin of the plurality of pins is inserted into the opening when the at least one pivotal outrigger is in the first position, and, wherein a second pin of the plurality of pins is inserted into the opening when the at least one pivotal outrigger is in the second position.

9. The microelectronic assembly of claim 8, wherein the loading mechanism body includes an opening therethrough wherein the microelectronic device resides within the opening.

10. The microelectronic assembly of claim 8, wherein the microelectronic device is electrically coupled to the microelectronic substrate with a microelectronic socket.

11. The microelectronic assembly of claim 8, wherein the microelectronic device is electrically coupled to the microelectronic substrate with a plurality of solder bump interconnects.

12. The microelectronic assembly of claim 8, further including a first heat dissipation device and wherein the at least one outrigger is positioned in first positioned to engage the first heat dissipation device.

13. The microelectronic assembly of claim 8, further including a second heat dissipation device and wherein the at least one outrigger is positioned in second positioned to engage the second heat dissipation device.

14. The microelectronic assembly of claim 8, wherein the at least one pivotal outrigger includes an attachment mechanism adapted to engage a heat dissipation device.

15. The microelectronic assembly of claim 14, wherein the attachment mechanism extends from the pivotal outrigger.

16. The microelectronic assembly of claim 15, wherein the attachment mechanism comprises a threaded collar.

17. The microelectronic assembly of claim 8, wherein the loading mechanism body further includes a recessed portion and wherein the pivoting outrigger further includes a recessed portion, and wherein pivoting outrigger recessed portion is pivotally attached to the loading mechanism body recessed portion.

18. The microelectronic assembly of claim 17, wherein the loading mechanism body recessed portion abutting the pivoting outrigger recessed portion is approximately the thickness of the loading mechanic body.

19. A system; comprising:

a housing; and a microelectronic assembly disposed within the housing, wherein the microelectronic assembly, comprises:

a microelectronic substrate;

a microelectronic device electrically coupled to the microelectronic substrate; and a heat dissipation device loading mechanism attached to the microelectronic substrate proximate the microelectronic device, wherein the heat dissipation device loading mechanism, includes:

a loading mechanism body; and at least one outrigger pivotally attached with a pivot pin to the loading mechanism body, wherein the outrigger is pivotal between a first position and a second position; and a position retention mechanism, separate from the pivot pin, retain the at least one pivotal outrigger in a position at or between the first position and the second position, wherein the position retention mechanism comprises a plurality of pins extending from at least one of the at least one pivotal outrigger and the loading mechanism body, and an opening in at least one pivotal outrigger and the loading mechanism body, wherein a first pin of the plurality of pins is inserted into the opening when the at least one pivotal outrigger is in the first position, and, wherein a second pin of the plurality of pins is inserted into the opening when the at least one pivotal outrigger is in the second position.

20. The system of claim 19, wherein the loading mechanism body includes an opening therethrough wherein the microelectronic device resides within the opening.

21. The system of claim 19, further including a first heat dissipation device and wherein the at least one outrigger is positioned in a first position to engage the first heat dissipation device.

22. The system of claim 19, further including a second heat dissipation device and wherein the at least one outrigger is positioned in a second position to engage the second heat dissipation device.

23. The system of claim 19, wherein the at least one pivotal outrigger includes an attachment mechanism adapted to engage a heat dissipation device.

* * * * *